United States Patent [19]

Hsieh et al.

[11] Patent Number: 5,459,417
[45] Date of Patent: Oct. 17, 1995

[54] APPARATUS FOR DETECTING DC CONTENT OF AN AC WAVEFORM

[75] Inventors: Samuel C. Hsieh, Marlboro; Charles M. Hansen, Jr., Tinton Falls, both of N.J.

[73] Assignee: AlliedSignal Inc., Morris Township, N.J.

[21] Appl. No.: 83,413

[22] Filed: Jun. 28, 1993

[51] Int. Cl.[6] .............................. H03K 5/153; H03K 5/00
[52] U.S. Cl. .................... 327/90; 327/72; 327/558
[58] Field of Search ...................... 307/494, 350, 307/358; 328/26, 167, 127; 330/310, 311, 306; 327/68, 70, 72, 90, 558

[56] References Cited

U.S. PATENT DOCUMENTS

| | | | |
|---|---|---|---|
| 3,696,252 | 10/1972 | Chapman | 328/167 |
| 3,867,702 | 2/1975 | Torpie | 328/26 |
| 4,158,818 | 6/1979 | Lerner | 307/494 |
| 4,243,940 | 1/1981 | Ruof | 328/26 |
| 4,835,482 | 5/1989 | Tamakoshi | 328/167 |

OTHER PUBLICATIONS

IBM Technical Disclosure Bulletin, vol. 4 No. 12, May 1962 p. 105.
IEEE Transactions on Circuits and Systems, vol. CAS-30 No. 7, Jul. 1983 pp. 474-488.

Primary Examiner—William L. Sikes
Assistant Examiner—Tiep H. Nguyen
Attorney, Agent, or Firm—Verne E. Kreger, Jr.

[57] ABSTRACT

A circuit for monitoring the DC content of an AC waveform includes a differential amplifier having one input connected to the AC waveform and the other input connected to a capacitive-coupled network that eliminates any DC component in the AC waveform at the frequency being monitored. Additional circuitry is required to cancel any phase shift and reactance of the coupling capacitor. The output of the differential amplifier is a signal which represents the amplitude and polarity of the DC content.

8 Claims, 1 Drawing Sheet

APPARATUS FOR DETECTING DC CONTENT OF AN AC WAVEFORM

BACKGROUND OF THE INVENTION

1. Field of the Invention

The present invention relates to detection circuits and more particularly to monitoring an AC waveform for its DC content.

2. Description of the Prior Art

Conventional AC generators and transformer coupled AC power converters provide AC waveforms which are free of steady-state DC components by virtue of the isolation provided by their electromagnetic circuits. For generators, the field is isolated from the armature. For transformer coupled AC power converters the output primary windings are isolated from the output secondary windings.

Some power conversion topologies do not provide for direct isolation, however. A DC power source is switched by switching devices to directly construct an AC waveform. The AC waveform is not electrically isolated from the DC source. As long as the switching elements perform their functions in a symmetrical manner such that the times that the switching elements connect the positive DC voltage and the negative DC voltage to the output is essentially equal, there will be no DC component in the output AC waveform. If the switching elements or their control circuits fail so that switching is no longer symmetrical, however, there can be a DC component in the AC output. This DC component can be detrimental to any utilization equipment connected to the AC converter.

In order to protect these loads, some means of detecting very small DC components in the AC waveform is required. Existing detection circuits using very low-pass filters are limited in accuracy, require expensive tight-tolerance capacitors or inductors, have slow response, reduced accuracy, drift with temperature, and may erroneously respond to low frequency modulation, or transient DC components caused by fault clearing, etc . . . .

SUMMARY OF THE INVENTION

The present invention provides a circuit having a differential amplifier with one input connected to an AC waveform which is to be monitored for DC content. The other input is connected to a capacitive-coupled network which eliminates any DC component in the AC waveform at the frequency being monitored. Additional circuit elements are used to cancel the phase shift and reactance of the coupling capacitor. The capacitive elements of the circuit are not critical and the circuit provides its intended function over a wide range of frequencies. The output of the differential amplifier is a signal which represents the amplitude and polarity of the DC content of the AC waveform. An additional gain stage (optional) and low-pass filtering creates a signal which can be sent to a detection circuit.

While particularly adaptable to AC electrical systems, the invention to be described herein can be used in any arrangement where the DC content of an AC waveform needs to be detected.

DETAILED DESCRIPTION OF THE INVENTION

Figure 1:
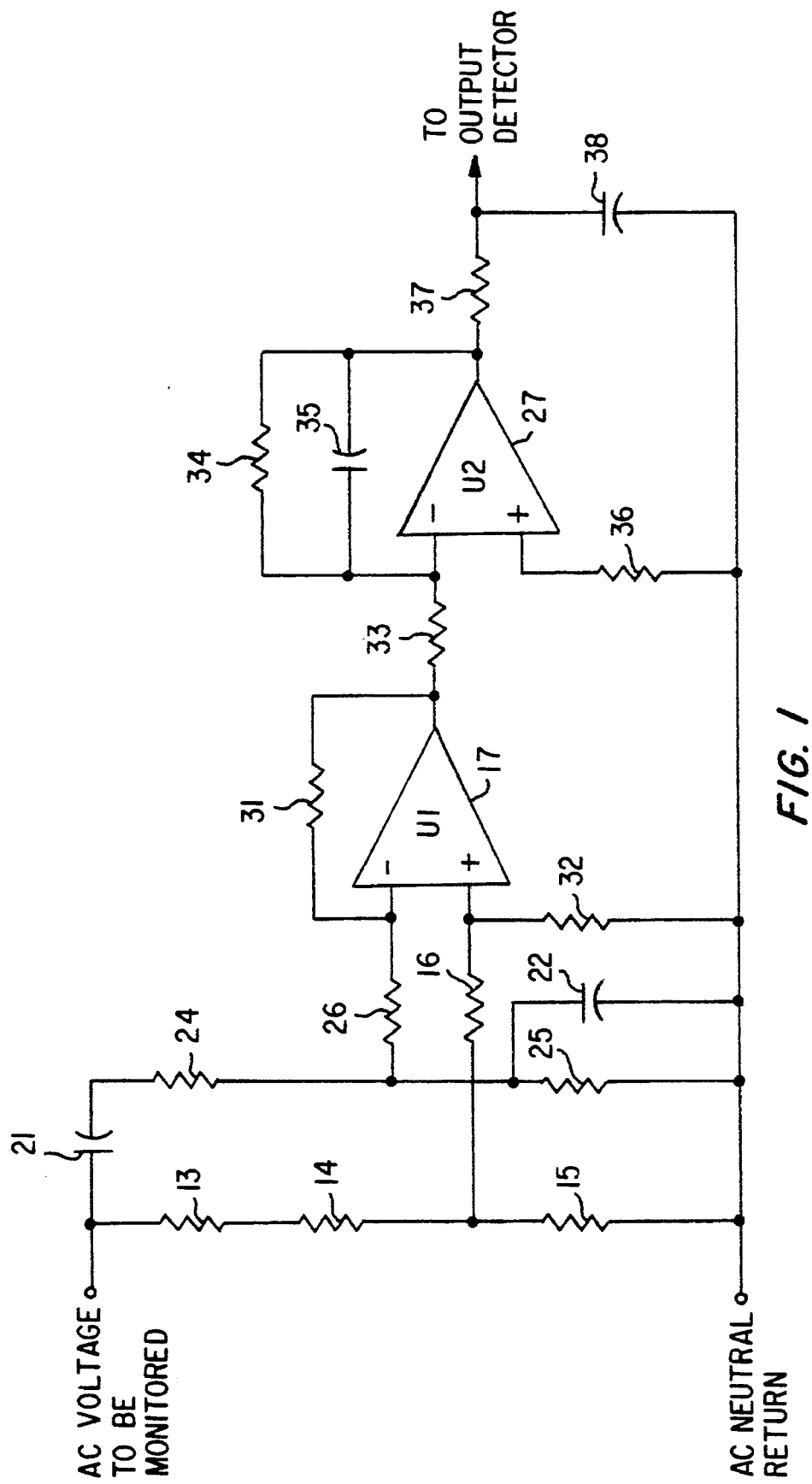
FIG. 1 illustrates an electrical schematic of a preferred embodiment of the present invention.

FIG. 1 illustrates a schematic of a DC content detector in accordance with a preferred embodiment of the present invention. The AC voltage to be monitored is connected to two voltage dividers. The first voltage divider comprises resistors 13, 14 and 15 and is connected at the junction of resistors 14 and 15, through resistor 16, to the non-inverting input of op-amp 17 . Connections to the inverting and non-inverting inputs can be interchanged if an output signal of the opposite polarity is desired.

A second voltage divider comprising capacitors 21, 22 and resistors 24, 25 is connected at the junction of resistors 24 and 25, through resistor 26, to the inverting input of op-amp 17. Capacitor 22 is used to compensate for the phase shift introduced by decoupling capacitor 21. Resistor 14 in the first voltage divider is used to add an additional voltage drop to compensate for the impedance of capacitor 21 at the frequency being monitored, to produce zero error when no DC component is present in the waveform. Alternate means of amplifier circuit nulling familiar to practitioners may also be used.

The differential inputs to op-amp 17 are provided through resistors 16 and 26. Resistors 31 and 32 determine the gain of the differential amplifier. The output of the differential amplifier is connected to the inverting input of op-amp 27 through resistor 33. Resistor 34 provides additional gain and capacitor 35 provides low-pass filtering to reduce any high frequency noise which may have been coupled through capacitor 21 to the differential amplifier circuit. Resistor 36 minimizes the offset error due to input bias current. An additional low-pass filter element is provided by resistor 37 and capacitor 38.

The output of op-amp 27 at the junction of resistor 37 and capacitor 38 represents the magnitude and polarity of the DC content of the AC waveform, and is connected to a suitable decision-making circuit such as a window detector, etc.

It is not intended that this invention be limited to the hardware or software arrangement, or operational procedures shown disclosed.. This invention includes all of the alterations and variations thereto as encompassed within the scope of the claims as follows.

What is claimed is:

1. A circuit for detecting DC content of an AC waveform, comprising:

a first voltage divider network connected to said AC wave form;

a second voltage divider network connected to said first voltage divider network, said second voltage divider network including a capacitive-coupled divider to eliminate said DC content of said AC waveform;

a differential amplifier connected to said first voltage divider network and said second voltage divider network;

a gain stage connected to said differential amplifier;

a low-pass filter connected to said gain stage; and said differential amplifier including differential inputs connected to said first voltage divider network through a first resistor and connected to said second voltage divider network through a second resistor, an operational amplifier connected to said differential inputs, and a resistor connected across said operational amplifier for determining the gain of said operational amplifier.

2. A circuit for detecting DC content of an AC waveform as claimed in claim 1 wherein said first voltage divider network comprises:

a resistor divider for sampling said AC waveform.

3. A circuit for detecting DC content of an AC waveform as claimed in claim 1 wherein:

said differential amplifier reproduces said DC content of said AC waveform.

4. A circuit for detecting DC content of an AC waveform as claimed in claim 2 wherein:

said low pass filter eliminates high frequency noise and provides magnitude and polarity of said DC content of said AC waveform.

5. A circuit for detecting DC content of an AC waveform as claimed in claim 1 wherein said gain stage comprises:

resistor inputs connected to said differential amplifier;

an operational amplifier connected to said resistor inputs;

a gain resistor connected across said operational amplifier; and, a low pass filtering capacitor connected across said operational amplifier.

6. A circuit for detecting DC content of an AC waveform as claimed in claim 1 wherein said low pass filter comprises:

resistor means connected to output of said gain stage; and, capacitor means connected to said resistor means.

7. A circuit for detecting DC content of an AC waveform, comprising:

a first voltage divider network connected to said AC waveform;

a second voltage divider network connected to said first voltage divider network;

a differential amplifier connected to said first voltage divider network and said second voltage divider network;

a gain stage connected to said differential amplifier;

a low-pass filter connected to said gain stage; and said differential amplifier including differential inputs connected to said first voltage divider network through a first resistor and connected to said second voltage divider network through a second resistor, an operational amplifier connected to said differential inputs, and a resistor connected across said operational amplifier for determining the gain of said operational amplifier, said operational amplifier including an inverting input connected to said first voltage divider network and a non-inverting input connected to said second voltage divider network.

8. A circuit for detecting DC content of an AC waveform, comprising:

a first voltage divider network connected to said AC waveform;

a second voltage divider network connected to said first voltage divider network;

a differential amplifier connected to said first voltage divider network and said second voltage divider network;

a gain stage connected to said differential amplifier;

a low-pass filter connected to said gain stage; and said differential amplifier including differential inputs connected to said first voltage divider network through a first resistor and connected to said second voltage divider network through a second resistor, an operational amplifier connected to said differential inputs, and a resistor connected across said operational amplifier for determining the gain of said operational amplifier, said operational amplifier including an inverting input connected to said second voltage divider network and a non-inverting input connected to said first voltage divider network.

* * * * *